Figure 3:
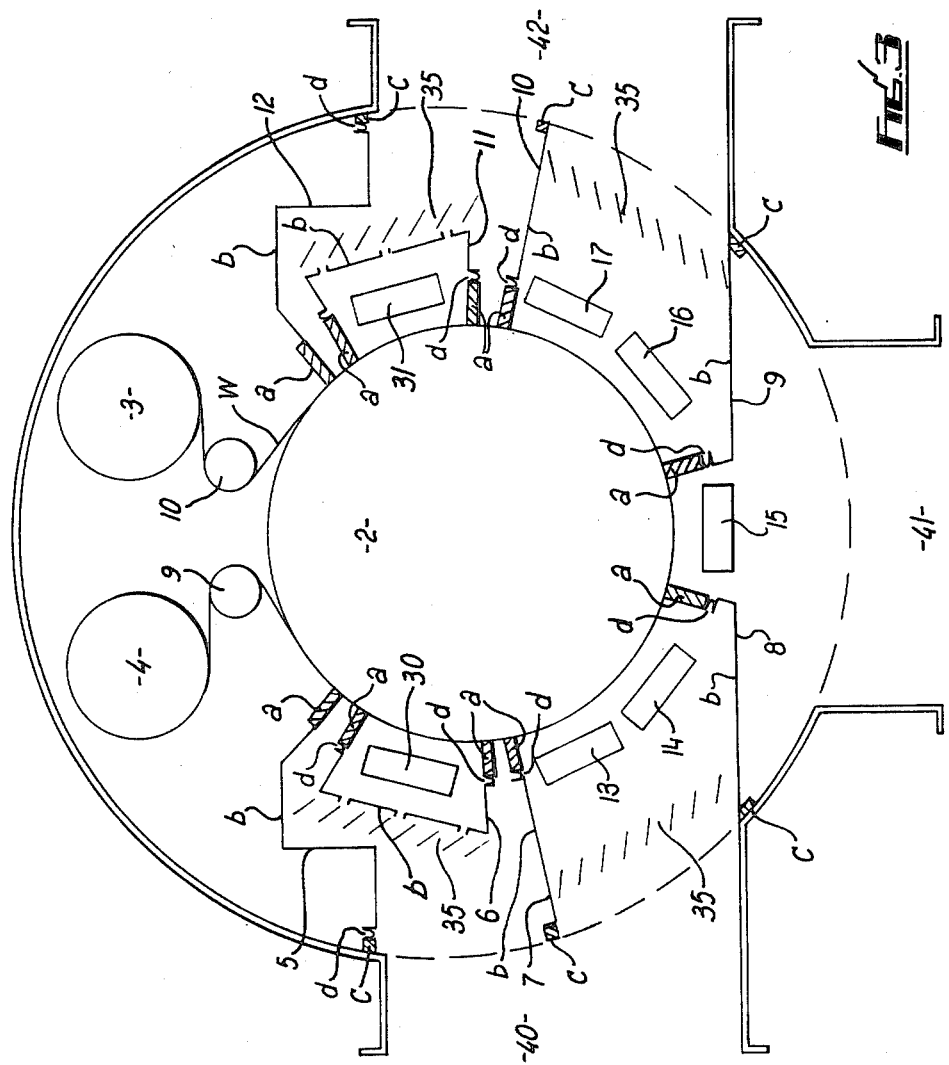

United States Patent [19]

Casey et al.

[11] Patent Number: 4,693,803
[45] Date of Patent: Sep. 15, 1987

[54] VACUUM COATING APPARATUS

[75] Inventors: Frank Casey, Rochdale; Paul A. Downing, Bury, both of England

[73] Assignee: General Engineering Radcliffe Limited, Radcliffe, England

[21] Appl. No.: 716,655

[22] Filed: Mar. 27, 1985

[30] Foreign Application Priority Data

Mar. 28, 1984 [GB] United Kingdom ............... 8408023

[51] Int. Cl.$^4$ ............................................. C23C 14/00
[52] U.S. Cl. .................................................. 204/298
[58] Field of Search .................. 204/298; 118/50, 501, 118/715, 718, 719, 720

[56] References Cited

U.S. PATENT DOCUMENTS 3,652,444  3/1972  Lester .................................. 204/298
4,014,779  3/1977  Kuehnle ............................... 204/298
4,026,787  5/1977  Kuehnle et al. ..................... 204/298
4,301,765  11/1981 Behn et al. .......................... 118/501
4,454,836  6/1984  Akashi et al. ....................... 118/718
4,508,049  4/1985  Behn et al. .......................... 118/720
4,526,131  7/1985  Shirahata et al. ................... 118/718

Primary Examiner—Arthur P. Demers
Attorney, Agent, or Firm—Fleit, Jacobson, Cohn & Price

[57] ABSTRACT

A vacuum coating apparatus has a housing defining a vacuum chamber in chamber which a working roll is disposed over which material to be processed can be drawn. The chamber is split into several sub-chambers by means of partitions and sputter metallizing sources and glow discharge units are disposed in the chambers. The partitions are adjustable and enable the disposition and function of the apparatus to be altered within the confines of the original apparatus design.

14 Claims, 4 Drawing Figures

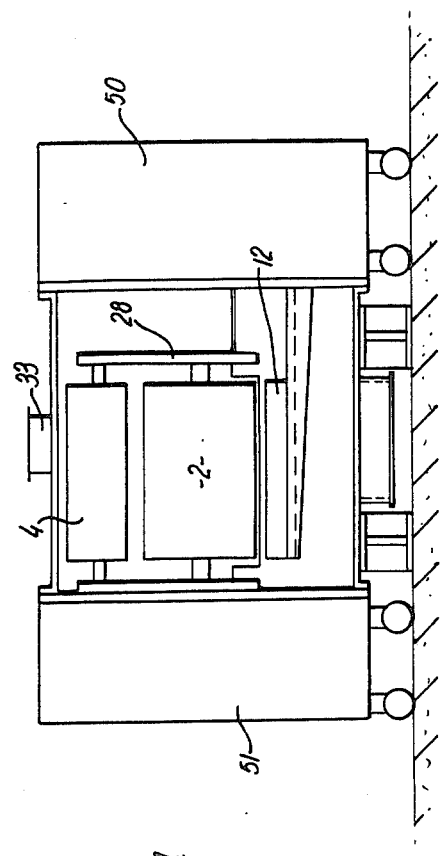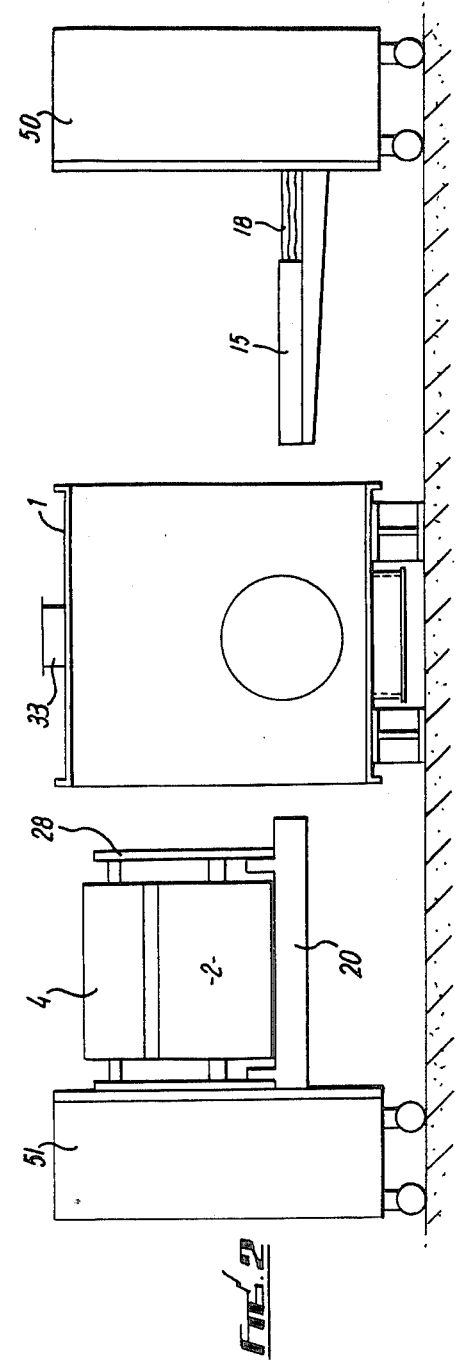

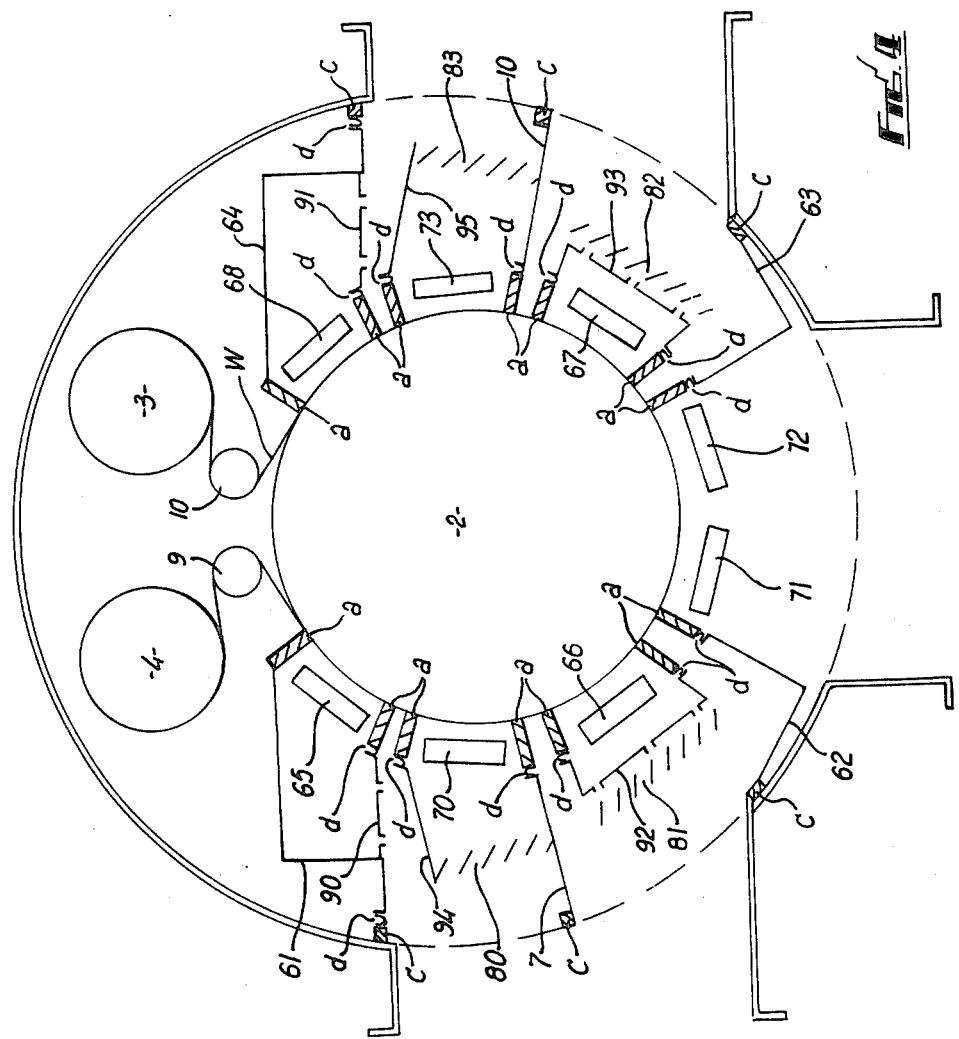

VACUUM COATING APPARATUS

The present invention relates to vacuum coating apparatus.

Apparatus of this broad general type is known. In one form of this apparatus, a flexible web of a material to be coated is transported past a source of a metal in a vacuum. As the material passes the metal source, the metal is sputtered onto the material to metallize it. Sputtering normally takes place in an inert gas atmosphere in which a plasma is produced. Ions in the plasma are accelerated towards the sputtering target by means of an electric field set up between an anode and a cathode. On striking the target, the ions cause atoms of the metal of the target to be ejected. These ejected atoms form the surface of the target travel to the material and coat it. Magnets associated with the target confine the plasma electrons to the region near the target giving them long spiralling paths about the field lines and increasing the number of ionising collisions per electron. By using inert gas, target metal may be deposited on the material in relatively pure form, since the gas does not react with the metal. However, reaction may under some circumstances be beneficial and under these circumstances the inert gas is "doped" with another gas, for example an oxide of the metal may be obtained by supplying oxygen. The gas or gases may be supplied direct to the target. Gaseous by products from the process are continuously pumped out from the chamber to maintain the level of vacuum in it.

More than one coating may be sequentially deposited on the material web and these layers may be of different substances. For each layer to be deposited an appropriate source of material is provided. If desired, means for cleaning disposed before or after one or more sources may also be provided. This may be in the form of a glow discharge unit. Generally each source or cleaning unit is contained within its own sub-chamber which forms part of the main vacuum chamber of the apparatus. It is usually necessary to isolate adjacent chambers from each other in order to inhibit the atmosphere from one sub chamber leaking into an adjacent sub chamber. Vacuum coating apparatus is generally large and represents a considerable capital investment. Decisions taken during the apparatus design stages in the light of priority requirements at the time may be difficult, if not impossible, to reverse at a later date without an expensive and time consuming redesign. Although sources may be exchanged in order to supply different coatings, thus providing some operational flexibility, this flexibility is limited.

According to the present invention there is provided vacuum coating apparatus comprising a housing defining a vacuum chamber, partition means for dividing the chamber into at least two sub-chambers, a process station disposed in one of the sub-chambers, and means for transporting a length of material past the process station in order to process the material, the partition means being adjustable in order to alter the formation of the sub-chambers.

In a preferred embodiment of the invention, the partition means comprises a number of partitions. Some of these partitions extend between a point adjacent a support for material to be processed and the internal surface of the vacuum chamber. Each of these partitions may comprise a cross beam adjacent the support, a further sheet part of variable form, a beam fixed to the internal surface of the chamber and a sliding seal between two of these parts. Some partitions may form an enclosure within the vacuum chamber. Such partitions may comprise a sheet part connected through respective sliding seals to cross beams adjacent the working surface. The sheet parts may be of metal. Each sub-chamber formed by the partitions may house one or more cleaning units or sputter metallizing sources. The cross beams may be connected to a member which is in turn connected to the support for the working surface. This facilitates the formation of precisely dimensioned gaps between the beams and the working surface. The position of the sliding seal, which may be made of rubber or neoprene and of C-shaped cross-section, may be varied as desired. The end of the part remote from the seal may be detachably fixed to the next adjacent part of the partition. Variable seal positions permit considerable flexibility in access to partition parts when the apparatus is opened up.

The sheet metal parts of the partitions may be straight or angled as desired. Several angles may be provided in any one part to provide for particular structural requirements.

The working surface may be provided by a roll and the cross beams mounted on a plate which is in turn connected via bearings to the shaft of the roll. Supply, take up and guide rolls may be provided for the material to be processed.

The invention also includes material processed by the above defined apparatus.

In order that the invention may be more clearly understood, two embodiments thereof will now be described, by way of example, with reference to the accompanying drawings, in which:

FIG. 1 is a simplified diagrammatic revealed view in side elevation of a vacuum coating apparatus with the apparatus parts in an operational position, FIG. 2 is a simplified diagrammatic view of the apparatus of FIG. 1 with the apparatus opened up and parts thereof displaced from one another, FIG. 3 is a detailed diagrammatic view in section of the vacuum chamber of vacuum coating apparatus according to the invention and of the general type shown in FIGS. 1 and 2, and FIG. 4 is a detailed diagrammatic view in section of an alternative vacuum chamber arrangement to that shown in FIG. 3.

Referring to FIGS. 1, 2 and 3, the vacuum coating apparatus comprises a housing 1 defining a cylindrical vacuum chamber. Disposed with this vacuum chamber is a cylindrical support or working roll 2. This roll is disposed centrally within and coaxial with the vacuum chamber. A supply or feed roll 3 is disposed to one side of the working roll 2 and a take-up roll 4 is disposed on the other side of the roll 2. Various guide rolls 9 and 10 are shown between the roll 2 and the rolls 3 and 4.

The vacuum chamber is split into several sub-chambers by means of partitions 5 to 12. The supply and take up rolls 3 and 4, guide rolls 9 and 10 and upper part of the working roll 2 are disposed in the upper part of the vacuum chamber which is partially defined by partitions 5 and 12. Five sputter metallising sources 13, 14, 15, 16 and 17 are disposed in sub-chambers formed between partitions 7, 8, 9 and 10 of the lower part of the vacuum chamber. Two glow discharge units 30 and 31 are respectively disposed in sub-chambers formed between partitions 5 and 7 and 10 and 12. Each of these sources and units is provided with its own gas, coolant (usually water) and electric power supply indicated generally by reference numeral 18 (see FIG. 2). For simplicity only the supplies to source 15 have been illustrated. These supplies are led in axially to the respective sources and units through appropriate respective terminal points in the axial end wall of the housing 1. This mode of connection for these supplies facilitates the opening and closing of the apparatus as compared, for example with bringing these supplies in from the bottom of the chamber. For clarity the partitions are not shown in FIGS. 1 and 2.

Referring to FIG. 3, each partition 5, 7, 8, 9, 10 and 12 comprises three parts respectively designated a, b and c. Parts a are cross beams supported via a frame 28 (see FIGS. 1 and 2) from the shaft on which roll 2 is supported and move axially with roll 2. Parts b are made of sheet metal material and can constitute the greater part of the respective partitions.

In the case of partitions 5 and 12, parts a are connected directly to parts b. In the case of partitions 6, 7, 8, 9, 10 and 11, parts a and b are sealingly connected to each other by means of seals d which permit axial relative slidable movement between the two parts. Each seal d, which is made of rubber or neoprene is of 'C' shaped cross section and is connected to the respective parts a by a nut (not shown). The free end of this seal slides sealingly on the adjacent edge of the partition part b. The form of each partition part b is chosen having regard to the particular shape of sub-chamber partially defined by that partition required. This in turn may be determined by the number and disposition of process stations, such as glow discharge units and/or metallizing sources, to be accommodated. Some partition parts b, such as those of partitions 5 and 12 may have quite complex shapes. Others, such as those of partitions 7 and 10, may be straight and extend substantially radially of the roll 2. Others still, such as those of partitions 8 and 9, may be angled with a section extending radially of the roll 2 and the remainder extending non-radially of the roll.

In the case of partitions 5, 7, 8, 9, 10 and 12, that end of the partition part b remote from the seal d is detachably fixed to the adjacent part of the partition. This detachable fixing may be a nut and bolt arrangement which can be undone to enable the partition part connected to it to be removed for exchange or replacement purposes. Thus, in the case of partitions 5 and 12 the radially inner ends of parts b are detachably fixed to respective cross beams and, in the case of partitions 7, 8, 9 and 10 the radially outer ends of parts b are detachably fixed to beams c which are welded to the interior surface of the vacuum chamber. These beams c are the third parts of the partitions mentioned above. The third parts of partitions 5 and 12 are also constituted by beams welded to the interior surface of the vacuum chamber.

The partitions 6 and 11 enclose respective glow discharge units 30 and 31. These partitions comprise sheet metal parts (referenced b) mounted at opposite ends through rubber or neoprene sliding seals (referenced d) on respective cross beams (referenced a). These enclosures are also adjustable and demountable to provide for exchange or replacement. Each partition part b defines a plurality of apertures through which gas from the respective unit can be drawn. Copper sheet baffles 35 are disposed adjacent partitions 6 and 11 and also in two of the other sub-chambers. The position of the baffles may be altered to control the amount of gas being drawn from their respective sub-chambers or enclosures by vacuum pumps (not shown) disposed adjacent chamber outlets 40, 41 and 42 and therefore, the degree of vacuum existing in those sub-chambers. A vacuum pump 33 is also provided on the external surface of the housing 1 for pumping out the upper half of the vacuum chamber via an exit located in the wall of that part of the chamber.

Each sputter metallising source comprises a cathode, which supports a target plate of the metal to be sputtered on a web W, and an anode which surrounds and acts as a housing for the cathode. A gas inlet is positioned above the target plate.

In operation of the above described apparatus, the chamber is evacuated, an electric field is set up across the anode and the cathode of each source via the power supply 18 to respective sources, and coolant and gas is supplied to respective sources. The web W is fed at a predetermined rate from the roll 3 over the roll 2 to the take-up roll 4. A plasma is created above each source and the charged ions of the plasmas are accelerated towards respective target plates by respective electric fields. Permanent magnets confine and form the ion streams onto the desired areas of the target plates. The impinging gas ions impart this energy to the atoms of the material of the respective target plates and those atoms are ejected from their respective target plates and travel towards the surface of the web W and coat it as it passes the respective sources. The gaseous products of the process are continuously pumped out of the sub-chambers in which the glow discharge units and sources are disposed by the vacuum pumps to maintain the vacuum in these sub-chambers. Vacuum is also maintained in the upper half of the chamber by means of the pump 33. Control of the gas supply rates and of these vacuum pumps enable considerable control of the pressures in the vacuum chambers. This control is such that the pressure in the sub-chambers housing the sources 13,14,15,16 and 17 and in the enclosures in which the glow discharge units 30 and 31 are disposed is less than the pressure in the upper part of the chamber which houses rolls 3 and 4 and greater than the pressure in the chamber outlets 40, 41 and 42.

The above described partitions enable the disposition and function of the apparatus to be altered within the confines of the original design. Such an alteration is illustrated in FIG. 4 which shows an alternative partition arrangement which in turn permits a different number and distribution of glow discharge units and sputter metallizing sources. In this arrangement partitions 5, 8, 9 and 12 are respectively replaced by partitions 61, 62, 63 and 64. As can be seen, these partitions have a different form to the partitions they replace and the sub-chambers they partially define correspondingly change. Four glow discharge cleaning units 65, 66, 67 and 68 are provided and four metallizing sources 70, 71, 72 and 73. These units and sources as can be seen are differently arranged to the sources and units of the arrangement of FIG. 3. Copper sheet baffles 80, 81, 82 and 83 are provided and are also differently arranged to the baffles of the arrangement of FIG. 3. As before each partition comprises three parts referenced a, b and c and incorporates a sliding seal d. Each glow discharge unit is disposed in its own enclosure. In the case of unit 65 this is formed by partition 61 and a further apertured partition part 90 extending between partitions 61 and through a sliding seal d to a cross beam a. The arrangement of unit 68 is similar, the further apertured partition in that case being referenced 91. The enclosures of units 66 and 67 are similar to those of units 30 and 31 of FIG. 3 the apertures partition parts in this case being referenced 92 and 93. Additional sheet metal partition parts 94 and 95 extend respectively between baffles 80 and 83 and, through sliding seals d to cross beams a to close off the sub-chambers for sources 70 and 73 respectively. In all other respects the arrangement of FIG. 4 is the same as that of FIG. 3 and corresponding parts bear the same reference numerals.

Referring particularly to FIGS. 1 and 2, when it is desired to open the vacuum chamber, for maintenance or to enable the above described alteration to be effected for example, the sources and cleaning units, which are connected to one trolley 50 are withdrawn from the housing 1 to the right and the web W winding mechanism comprising the feed, take up, guide and working rolls 2, 3, 4, 9 and 10 which are connected to a second trolley 51, are withdrawn to the left. This separation of the sources and units from the remainder of the apparatus exposes them immediately for inspection maintenance and replenishments with a consequent saving in labour, apparatus downtime and expense. Furthermore, because the sources are fed with gas, coolant and power axially no disconnection of services is necessary as is the case when the sources are fed with these supplies through the base of the apparatus. The ready accessibility to the sources facilitates removal and/or cleaning of the target. The disposition of the partition parts a and the provision of the associated baffles 24 facilitates the setting of the gap between the partitions and the roll 2 (parts a and the roll 2 are connected together). The baffles also enable the deposition of metals on the web to be substantially vertical. This columbular growth has distinct advantages in certain applications, the production of recording tape for example, since the pumps are disposed externally of the chamber, they can be inspected and maintained without opening the chamber.

The construction of the partitions, each incorporating as they do a neoprene or rubber sliding seal of 'C' shaped cross section, permits great flexibility as to their movement. In the case of the FIG. 3 arrangement parts a and b of partitions 5 and 12 move out with the trolley 51, parts b of partitions 6 and 11 move out with trolley 50 and parts b of partitions 7, 8 9 and 10 remain in the chamber but will of course be detached if replacement is necessary. Also cross beams a move with the roll 2, and all beams c are welded to the interior surface of the chamber.

It will be appreciated that the above embodiment has been described by way of example only and many variations are possible without departing from the scope of the invention. For example, if coating on both sides of the web were required, the arrangement would be duplicated within the vacuum chamber one side of the web being coated on a pass over a first working roll and the other one being coated on a pass over a second working roll, each roll having associates with it an appropriate number of sub-chambers. Also, although nuts and bolts have been described as the means for detachably mounting partition parts b in position, any other suitable mounting may equally well be used.

What is claimed is:

1. A vacuum coating apparatus comprising a housing defining a vacuum chamber, partition supporting means carried within the chamber, a plurality of removable and replaceable partition means engageable with the partition supporting means for dividing the chamber into at least two sub-chambers, a process station disposed in one of the sub-chambers, and means for transporting a length of material past the process station in order to process the material, wherein the removal and replacement of at least one of the partition means permits alteration of the shape and relative positions of the sub-chambers.

2. A vacuum coating apparatus as claimed in claim 1, in which the partition means comprises a number of partitions and one at least of these partitions extends between a point adjacent a support for material to be processed and the internal surface of the vacuum chamber.

3. A vacuum coating apparatus as claimed in claim 1, in which the partition means comprises a number of partitions and each partition comprises a cross beam adjacent a support for material to be processed, a further sheet part of variable form, a beam fixed to the internal surface of the chamber and a sliding seal between two of these parts.

4. A vacuum coating apparatus as claimed in claim 1, in which the partition means comprises a number of partitions and one partition forms an enclosure within the vacuum chamber.

5. A vacuum coating apparatus as claimed in claim 4, in which the said one partition comprises a sheet part connected through respective sliding seals to cross beams adjacent the working surface.

6. A vacuum coating apparatus as claimed in claim 3, in which the sheet parts are of metal.

7. A vacuum coating apparatus as claimed in claim 1, in which the process station is a cleaning unit.

8. A vacuum coating apparatus as claimed in claim 1, in which the process station is a sputter metallizing source.

9. A vacuum coating apparatus as claimed in claim 3, in which the cross beam is connected to a member which is in turn connected to the support in order to facilitate the formation of precisely dimensioned gaps between the beam and the support.

10. A vacuum coating apparatus as claimed in claim 3, in which the position of the sliding seal is variable.

11. A vacuum coating apparatus as claimed in claim 3, in which the sliding seal is of rubber or neoprene.

12. A vacuum coating apparatus as claimed in claim 3, in which the sliding seal is of L-shaped cross-section.

13. A vacuum coating apparatus as claimed in claim 3, in which the end of the part remote from the seal is detachably fixed to the next adjacent part of the partition.

14. A vacuum coating apparatus as claimed in claim 3, in which the support for material to be processed comprises a roll and the or each cross-beam is mounted on a plate which is in turn connected via bearings to the shaft or the roll.

* * * * *